United States Patent [19]
Theron et al.

[11] 4,290,021
[45] Sep. 15, 1981

[54] BATTERY TESTING METHOD AND DEVICE

[76] Inventors: Jacob J. Theron, 57 Charlie Ave., Fontainebleau, Randburg, Transvaal; Bernardus J. Bout, Plot No. 47, Blignautsrus, Walkerville, Transvaal; Jacobus P. Van Wyk, 25 Second Ave., Florida, Transvaal; Michael D. De Lange, 12 Godalming Ave., Mulbarton, Johannesburg, Transvaal, all of South Africa

[21] Appl. No.: 35,274

[22] Filed: May 1, 1979

[30] Foreign Application Priority Data

May 1, 1978 [ZA] South Africa ................ 78/2491

[51] Int. Cl.$^3$ ............................................. G01N 27/46
[52] U.S. Cl. ..................................... 324/429; 324/425
[58] Field of Search ............... 324/426, 427, 429, 430, 324/432–435; 320/40, 48; 328/132, 151

[56] References Cited

U.S. PATENT DOCUMENTS

| | | | |
|---|---|---|---|
| 3,593,099 | 7/1971 | Sholl ........................... | 324/429 |
| 3,680,072 | 7/1972 | Charbonnier et al. ......... | 324/430 |
| 4,052,717 | 10/1977 | Arnold et al. ................. | 324/432 |
| 4,080,560 | 3/1978 | Abert ........................... | 324/429 |

OTHER PUBLICATIONS

Hirayama et al. "Automatic Measuring System for a Control of Standard Cells" IEEE Trans. Inst. and Mea. vol. 1m-21, No. 4, 11/72.

*Primary Examiner*—David K. Moore
*Attorney, Agent, or Firm*—Cushman, Darby & Cushman

[57] ABSTRACT

The invention provides apparatus for testing the condition of a battery comprising a load, means to connect the battery to the load for a predetermined interval and means to measure the battery voltage at least at the end of the interval.

The invention further extends to apparatus for successively testing the condition of a plurality of batteries comprising means for connecting one of the batteries to a given load for a predetermined interval, means for measuring the voltage of the battery at least at the end of the interval, means for determining the condition of the battery from the voltage measurement, and control means for connecting a fresh battery to the load and repeating the testing of the batteries until all the batteries are tested.

The invention also provides a method of testing the condition of a battery including the steps of connecting the battery in a charged condition to a load for a predetermined interval, and measuring the battery voltage at least at the end of the interval.

8 Claims, 4 Drawing Figures

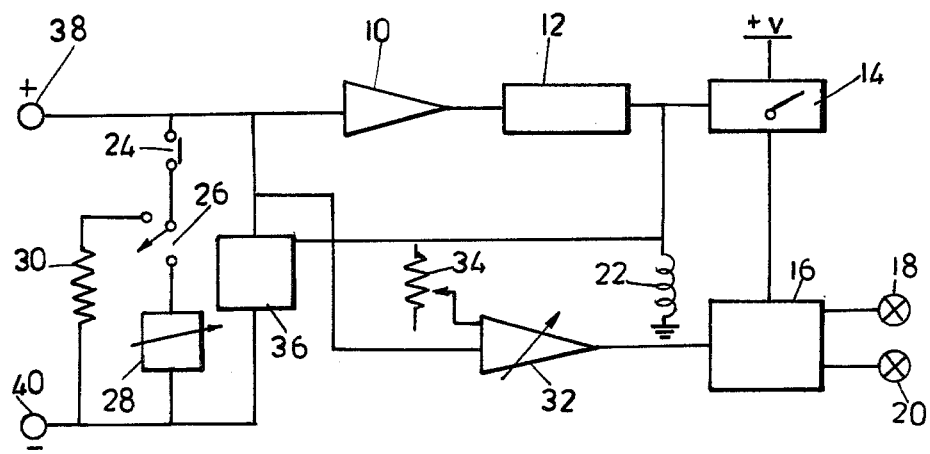
FIG_1
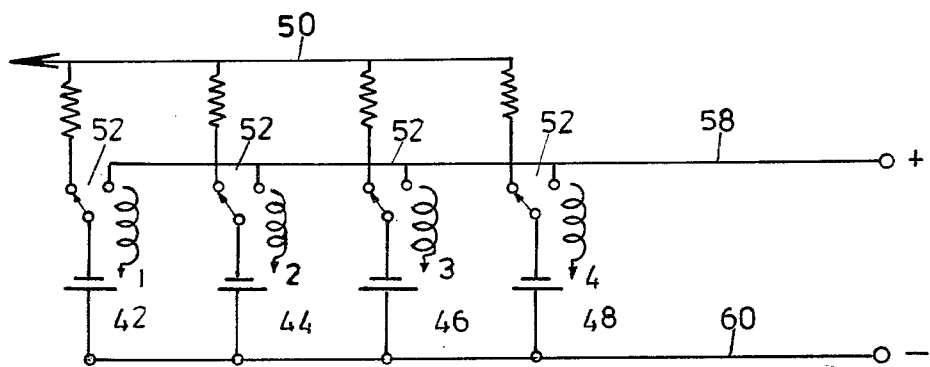
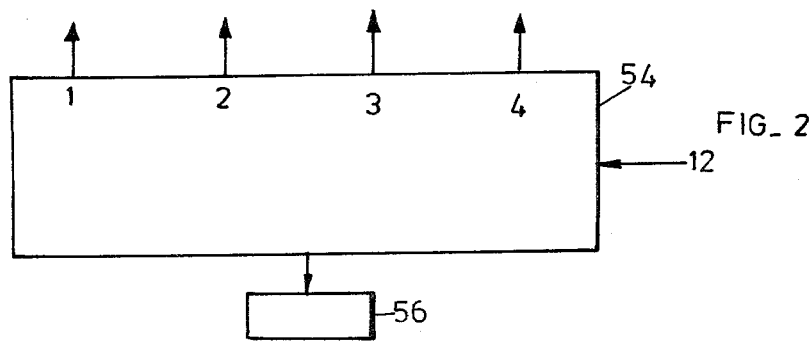
FIG_2

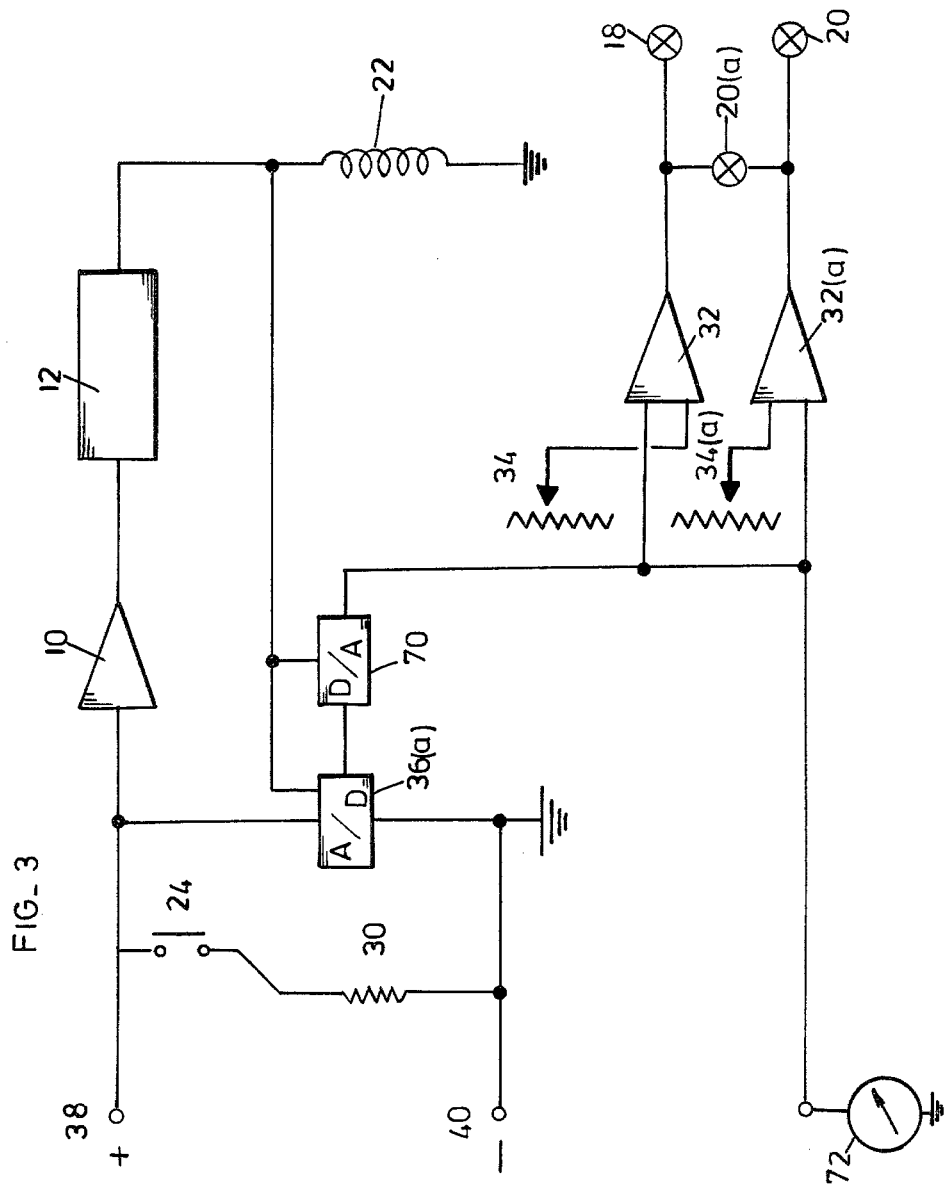
FIG_3

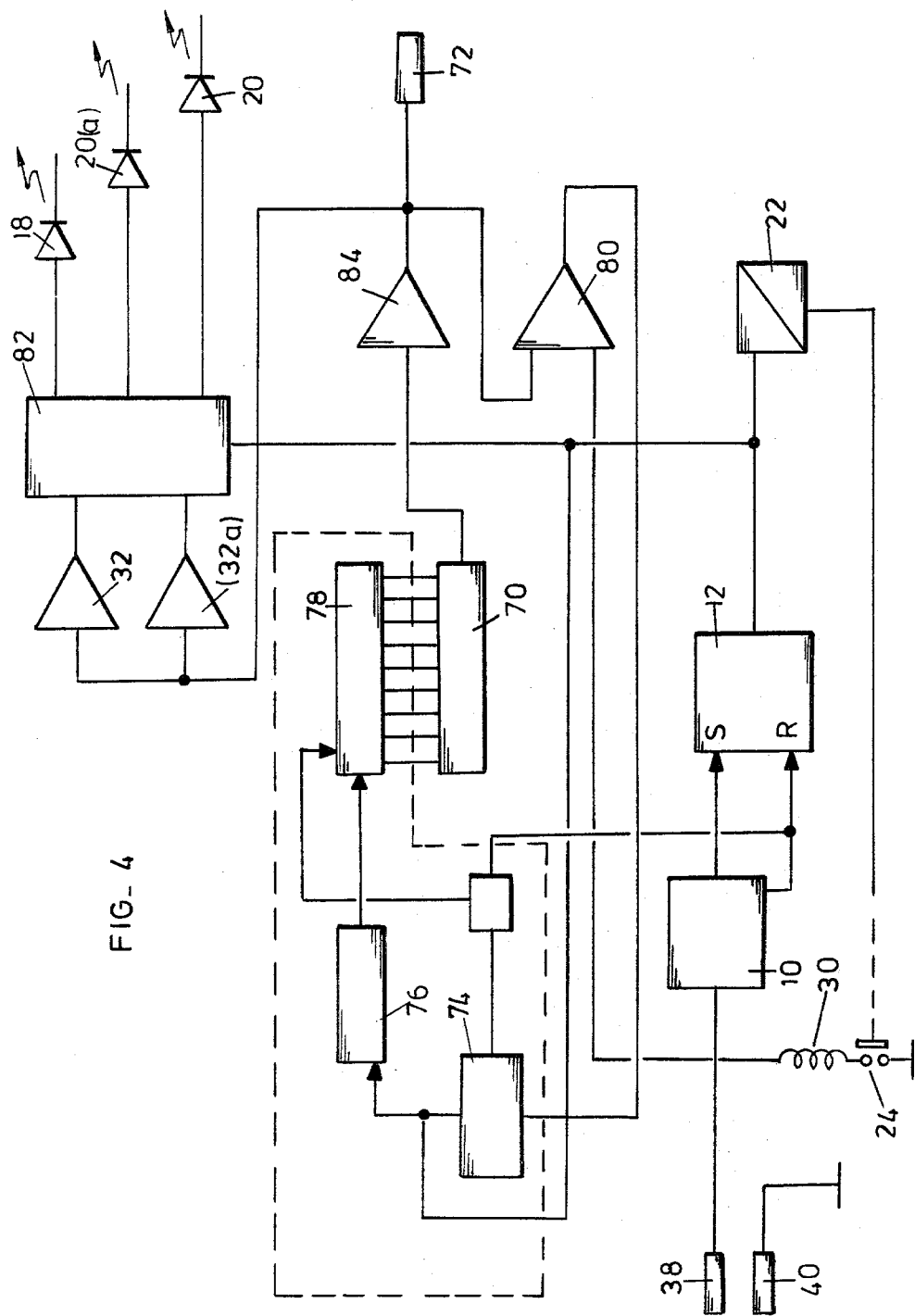
FIG_4

BATTERY TESTING METHOD AND DEVICE

BACKGROUND OF THE INVENTION

THIS invention relates to the testing of batteries.

It is frequently necessary to know the condition of a battery. For example on the mines and other underground workings, workers are issued with cap lamps which are powered by rechargeable batteries. The issue of these lamps takes place from a central store which usually is located on surface. Consequently a worker underground whose battery fails in the middle of a shift is unable easily to replace his batteries with a sound or fully charged battery and usually his productivity during the remainder of the shift suffers drastically.

SUMMARY OF THE INVENTION

It is an object of the present invention to provide a method of testing the condition of a battery which is reliable, which lends itself to adaptation for use with a variety of battery types, and which can be incorporated in an automatic or manually operated battery testing system.

The invention provides a method of testing the condition of a battery which includes connecting the battery in a charged condition to a load for a predetermined interval, and measuring the battery voltage at least at the end of the interval.

The load may be a resistive or a constant current load.

Further according to the invention the battery is charged for a predetermined period before being connected to the load.

Further according to the invention the battery voltage is measured during the interval. The battery voltage may be measured continuously or intermittently during the interval.

Further according to the invention the battery voltage is measured digitally.

Further according to the invention the method includes the steps of converting the digital battery voltage measurement into an analogue signal.

The invention also provides a method of successively testing the condition of a plurality of batteries, each battery having been charged for a predetermined period, the method including the steps of:

(a) connecting one of the batteries to a load for a predetermined interval;

(b) measuring the battery voltage at least at the end of the interval;

(c) determining the condition of the battery from the voltage measurement;

(d) automatically connecting a fresh battery to the load; and (e) repeating steps (b), (c) and (d) until all the batteries are tested.

The invention also extends to an apparatus for testing the condition of a battery which comprises a load, means to connect the battery to the load for a predetermined interval and means to measure the battery voltage at least at the end of the interval.

The load may be a resistive, or a constant current, load.

The battery voltage may be measured continuously or intermittently during the interval. In the latter case the battery voltage is sampled during each of a plurality of sub-intervals of the interval and each sampled voltage is measured.

Further according to the invention the measuring means provides an analogue indication of the battery voltage.

Further according to the invention the measuring means includes means to provide a digital measure of the battery voltage, means to monitor the digital measure after the end of the interval, means to convert the digital measure into an analogue signal, and means to provide a visual display of the analogue signal.

Further according to the invention the measuring means includes means to compare the measured battery voltage to at least one reference value, and means responsive to the comparison means which indicates the condition of the battery.

Further according to the invention the connecting means comprises a timer, a level detector and switch means, the level detector on connection to a battery whose voltage exceeds a predetermined minimum starting the timer and operating the switch means so as to connect the load to the battery and the timer after the predetermined time disconnecting the load from the battery.

The invention further extends to apparatus for successively testing the condition of a plurality of batteries which comprises means for connecting one of the batteries to a given load for a predetermined interval, means for measuring the voltage of the battery at least at the end of the interval, means for determining the condition of the battery from the voltage measurement, and control means for connecting a fresh battery to the load and repeating the testing of the batteries until all the batteries are tested.

The control means may comprise a data logger or scanner. Suitably the apparatus includes means to record the identity of each battery and its condition.

A BRIEF DESCRIPTION OF THE DRAWINGS

The invention is further described by way of example with reference to the accompanying drawings in which:

FIG. 1 is a circuit diagram of apparatus according to the invention for testing the condition of a battery, FIG. 2 illustrates the manner in which the apparatus of FIG. 1 is used for testing a plurality of batteries, and FIGS. 3 and 4 illustrate a second form of apparatus according to the invention.

DESCRIPTION OF PREFERRED EMBODIMENTS

Referring to FIG. 1 the apparatus of the invention consists of a first level detector 10, a timer 12, an electronic switch 14, a hold circuit 16 connected to a green lamp 18 and a red lamp 20, a relay 22 with contacts 24 connected in series with a two-way switch 26, a variable constant current load 28 connected to one terminal of the switch 26, a resistive load 30 connected to the other terminal of the switch 26, a second level detector 32, a variable voltage source 34 and a digital volt meter 36 which is connected across two terminals 30 and 40.

In practice a battery which has been connected to a charger for a period calculated to charge the battery fully is connected to the terminals 38 and 40. The battery voltage is sensed by the first level detector 10 and if the battery voltage is above a certain minimum value the timer 12 is turned on. When the timer goes on the relay 22 is energised and the contacts 24 are closed. The closure of these contacts connects the battery to either the resistive load 30 or the constant current load 28. It is preferred that the battery be connected to the constant current load so that a predetermined charge can be drained from the battery for a preset time. The period for which the battery is connected to the constant current load 28 is determined by the timer 12. After a suitable interval the timer 12 de-energizes the relay coil 22 and simultaneously closes the electronic switch 14.

While the battery is loaded its voltage is constantly monitored by the digital volt meter 36. The battery voltage as measured by this volt meter is applied to the second level detector 32 where it is compared with a voltage tapped from the constant voltage source 34. The voltage which is tapped from the source 34 is determined empirically, as are the value of the constant current load 28 and the timing interval of the timer 12. These three values are chosen according to the battery type so that, after the battery has been tested by the apparatus the battery is found to be healthy when its voltage exceeds the tapped voltage.

If this is so the level detector 32 generates a signal which is applied to the hold circuit which is energized by the voltage V on closure of the electronic switch 14. The green lamp 18 is therefore energized indicating that the battery is sound. On the other hand if the battery voltage is lower than the tapped voltage from the source 34 the red light 20 is energized indicating that the battery is unsound. Should the battery voltage drop below the tapped level of the second level detector before the timing cycle has expired the test sequence is immediately terminated.

The constant current load 28 is preferably a transistor. This enables the value of the load to be altered by varying the bias applied to the transistor. Moreover the settings of the timer 12 and the second level detector 32 are adjustable to take into account different batteries and different discharge periods.

The lamp 18 or 20 which is energized will remain energized notwithstanding the fact that the testing operation is terminated at this point. The timer 12 will start another test cycle, only after a second battery has been connected to the terminals 38 and 40.

FIG. 2 illustrates the manner in which the apparatus of FIG. 1 can be used to test a multitude of batteries. Referring to FIG. 2 a plurality of batteries 42, 44, 46 and 48 are connected to a common bus 50 leading to a charger, not shown. The batteries are thus charged in parallel. The conductor leading from the bus 50 to each battery passes through a two-way reed switch 52.

The operation of the various switches 52 is controlled by means of a data logger or scanner 54. The scanner is connected to the timer 12 and to a printer 56.

In use, a conductor 58 which is common to the switches 52, and a conductor 60 which is common to the batteries, are connected to the terminals 38 and 40 respectively of the apparatus of FIG. 1. The batteries 42 and 48 are charged in parallel for a predetermined time calculated to bring them to a state of full charge if they are healthy. Thereafter the first battery 42 is tested with the apparatus of FIG. 1 in the manner already described. When the timer 12 closes the switch 14 in FIG. 1 a pulse is simultaneously applied to the scanner 54 whereupon the reed switch 52 associated with the battery 42 is operated by the scanner to re-connect the battery 42 to the charger. Simultaneously the reed switch associated with the battery 44 is operated by the scanner to connect this battery to the conductor 58. The condition of this battery is thus tested by the apparatus of FIG. 1.

The process continues in this manner, at a rate determined by the timer 12, until all the batteries in a particular series are tested. After each battery is tested, i.e. at the end of each timing interval of the timer 12, the printer 56 records the number of the battery in the sequence of batteries, the voltage of the battery at the end of the test period, and the condition of the battery.

The apparatus of FIG. 2 in combination with that of FIG. 1 lends itself particularly to the large-scale testing of batteries. It therefore finds particular application to the testing of batteries for cap lamps for miners for such batteries are placed in numbered racks at the end of each shift and recharged automatically.

A simplified version of the apparatus of FIG. 1, designed to be incorporated in an easily transported, manually operated instrument, is shown in block diagram form in FIG. 3. The components of the apparatus of FIG. 3 which are identical to components of the apparatus of FIG. 1 are designated by the same reference numerals. The apparatus thus includes a level detector 10, a timer 12, a relay coil 22, a resistive load 30, an analogue to digital convertor 36(a) which is the direct equivalent of the digital volt meter 36 of FIG. 1, a digital to analogue converter 70 which has no counter part in the apparatus of FIG. 1, a first level detector 32 which is connected to a variable voltage source 34 and to the output of the digital to analogue converter 70, and a second level detector 32(a) which is connected to a second variable voltage source 34(a) and to the output of the digital to analogue converter 70. The outputs of the two level detectors 32 and 32(a) are connected to three lamps 18, 20 and 20(a). The output of the digital to analogue converter 70 is connected to an analogue meter 72. Other suitable devices could also be connected to the converter.

The operation of the circuit of FIG. 3 is very similar to that of the circuit of FIG. 1. A battery which has been connected to a charger for a period calculated to charge the battery fully is connected to the input terminals 38 and 40 of the apparatus. The battery voltage is sensed by the level detector 10 and if the battery voltage is above a certain minimum value the timer 12 is turned on. The relay 22 is thereby energized and the contacts 24 are closed connecting the resistive load to the battery.

While the battery is connected to the load its voltage is monitored by the analogue to digital converter 36 and the output of this converter is re-converted to analogue form by the digital to analogue converter 70. The process of converting an analogue signal to digital and then converting it back to an analogue signal has the advantage that once the original analogue signal is removed the digital signal is maintained and therefore the output analogue signal is also maintained.

The output analogue signal of the converter 70 is applied to the two level detectors 32 and 32(a). Each of these detectors compares the battery voltage to that tapped from the respective voltage sources 34 and 34(a) and the output levels of the two level detectors are used to energize one of the three lamps 18, 20 and 20(a) depending on the battery condition. For example if the battery voltage is above a predetermined level a green lamp would be energized indicating that the battery is in a healthy condition. If the battery voltage is below this first predetermined level but above a second level then a second light, say amber in colour, would be energized indicating that the battery if re-cycled would be restored to a healthy condition. Finally, if the battery voltage is below the second predetermined level the third lamp, which is red, will be energized indicating that the battery had failed completely and that it would have to be replaced.

At the end of the timing interval determined by the timer 12 the relay 22 is de-energized and the contacts 24 are opened disconnecting the battery from the resistive load 30. The operator of the instrument at this stage is given an indication of the battery voltage, in analogue form, by means of the meter 72 and simultaneously is able to determine by means of the lamps 18, 20 and 20(a) what action is called for in respect of the battery under test.

FIG. 4 illustrates a circuit diagram in slightly more detail of an instrument based on the principles described with reference to FIG. 3. Again those components which are identical to components of the circuit of FIG. 3 are labelled with the same reference numbers.

The analogue to digital converter in this example consists of a hold circuit 74, as oscillator 76 and a counter 78. The digital to analogue converter 70 consists of a resistive-ladder network. The three globes 18, 20 and 20(a) consist of red, amber and green light emitting diodes respectively which are driven by means of the level detectors 32 and 32(a) via an LED display logic unit 82.

When a battery is connected to the input terminals 38 and 40 of the device the level detector 10 senses the input voltage of the battery and if this voltage exceeds a predetermined level the timer 12 is actuated. This in turn causes the relay 22 to be energised and the contacts 24 are closed connecting the load 30 to the battery. The battery voltage is applied to the comparator 80 and the output of the comparator is in effect sampled by the hold circuit 74 and held by the circuit. The oscillator 76 then starts oscillating and its output pulses are accumulated by the binary counter 78 and converted into an analogue signal by the resistive-ladder network 70. The output analogue signal of the network 70 is applied to a buffer 84 before being applied to the analogue meter 72.

The output signal of the buffer 84 in fact rises from zero very rapidly until it is equal to the voltage of the battery. A typical period for the output voltage of the buffer to rise to the battery voltage is 100 milliseconds. Once the two voltages are equal the oscillator is turned off and the counter then stops counting. However, the count in the counter is maintained and consequently the analogue output signal of the network 70, and hence of the buffer 84, is maintained. After a period which typically is in the region of 900 milliseconds the binary counter 78 is reset and the oscillator 76 is restarted. The cycle then recommences and the binary counter counts upwards to a value at which its converted analogue equivalent is again equal to the battery voltage. Consequently, at intervals of approximately one second the battery voltage is measured, during an interval of approximately 100 milliseconds, and the measured voltage is then applied to the meter 72 for the remainder of the one second interval, i.e. for approximately 900 milliseconds.

The output analogue signal of the buffer 84 is also applied to the two level detectors 32 and 32(a) and depending on the battery voltage one of the three light emitting diodes is activated. For example, if the battery voltage is above 2,6 volts the green diode 18(a) is actuated indicating that the battery condition is satisfactory. If the battery voltage is below 1,3 volts the red diode 20 is actuated indicating that the battery is in a poor condition and is not capable of being repaired. On the other hand if the battery voltage is between 1,3 and 2,6 volts the amber diode 20(a) is actuated indicating that although the battery cannot be recharged it can be reconditioned.

Apparatus of the type described with reference to FIGS. 3 and 4 can be incorporated in an easily transportable manually operated instrument and the invention is intended to extend to an application of this type, or the apparatus can be built into standard charging racks.

We claim:

1. A method of testing the condition of a battery, comprising the steps of sequentially:
   (a) connecting up the battery to a charger for a period of time sufficient to fully charge the battery;
   (b) sensing the battery voltage with a first level detector;
   (c) if the battery voltage sensed with the first level detector is greater than a predetermined minimum, withdrawing a predetermined charge from the battery by (c1) effecting operation of a timer, (c2) upon effecting timer operation connecting up the battery to a non-resistive constant current load, and (c3) drawing constant current from the battery with the load for a predetermined period of time determined by the timer;
   (d) while the battery is connected to the constant current load, sensing the voltage thereof and comparing the sensed voltage to a voltage tapped from a constant voltage source; and
   (e) operating an indicator if the battery voltage measured in step (d) is greater than the voltage tapped from a constant voltage source.

2. A method as recited in claim 1 comprising the further steps of, for a given type of battery, empirically determining the value of the constant current load, the time interval of the timer, and the voltage tapped from the constant voltage source, to provide proper predetermined values for steps (c2), (c3), an (d) for that particular battery type; and adjusting the values of the timer, constant current load, and tapped voltage to effect proper testing of that particular battery type.

3. A method as recited in claims 1 and 2 wherein step (c2) is practiced by connecting up the battery to a transistor, and varying the bias applied to the transistor to adjust the value of the constant current being withdrawn.

4. Apparatus for testing the condition of a battery, comprising:
   a first level detector for sensing battery voltage;
   a timer;
   a non-resistive constant current load;
   a tapped constant voltage source;
   a second level detector for sensing battery voltage;
   voltage comparator means; and
   circuitry means for: interconnecting a battery to said first level detector; interconnecting said first level detector to said timer so that said timer will be actuated if the battery voltage sensed by said first level detector is greater than a predetermined minimum; interconnecting said timer and the battery with said constant current load so that said load will draw constant current from the battery for a predetermined period of time determined by the timer; interconnecting said second voltage detector with the battery so that said constant current load; and interconnecting said tapped constant voltage source and said second voltage detector with said comparator means to determine whether or not the sensed voltage is greater than a predetermined amount set by said tapped constant voltage means.

5. Apparatus as recited in claim 4 wherein said non-resistive constant current load comprises a transistor, and means connected to said transistor for varying the bias applied thereto to thereby adjust the value of the constant current being withdrawn.

6. Apparatus as recited in claim 5 further comprising means for adjusting the time interval of said timer, and the voltage tapped from said constant voltage source, to provide proper predetermined values for a given type of battery to be tested.

7. Apparatus as recited in claim 4 comprising means for adjusting the time interval of said timer, the value of the constant current being withdrawn by said constant current load, and the voltage tapped from said constant voltage source, to provide proper predetermined values for a given type of battery to be tested.

8. Apparatus for testing the condition of a battery, comprising: means for withstanding a predetermined charge from the battery, said means including a transistor which comprises a constant current load, a timer for controlling the time said transistor draws a constant current load from the battery, and means connected to said transistor for varying the bias applied thereto to thereby adjust the value of the constant current being withdrawn thereby;

a battery voltage sensing means;

a voltage comparator; and circuitry means interconnecting said battery voltage sensing means and said voltage comparator to determine whether or not the sensed voltage is greater than a predetermined amount.

* * * * *